(12) United States Patent
Jeon et al.

(10) Patent No.: US 7,692,196 B2
(45) Date of Patent: Apr. 6, 2010

(54) MEMORY DEVICES AND METHODS OF MANUFACTURING THE SAME

(75) Inventors: In-Sang Jeon, Seoul (KR); Sang-Bom Kang, Seoul (KR); Dong-Chan Kim, Anyang-si (KR); Chul-Sung Kim, Seongnam-si (KR); Sug-Hun Hong, Yongin-si (KR); Sang-Jin Hyun, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 302 days.

(21) Appl. No.: 11/655,689

(22) Filed: Jan. 19, 2007

(65) Prior Publication Data

US 2008/0164508 A1     Jul. 10, 2008

(30) Foreign Application Priority Data

Oct. 24, 2006    (KR) .................. 10-2006-0103430

(51) Int. Cl.
    *H01L 27/108* (2006.01)
(52) U.S. Cl. .............. 257/68; 257/71; 257/296; 257/304; 257/908; 257/E27.084
(58) Field of Classification Search ........... 257/68, 257/71, 296, 304, 908
    See application file for complete search history.

(56) References Cited

U.S. PATENT DOCUMENTS 5,155,351 A * 10/1992 Yamanobe et al. ......... 257/435
2003/0030099 A1* 2/2003 Hsieh et al. ............... 257/315
2006/0281260 A1* 12/2006 Lue ........................... 438/264
2007/0052011 A1* 3/2007 Bhattacharyya ............ 257/324
2007/0120179 A1* 5/2007 Park et al. .................. 257/324

FOREIGN PATENT DOCUMENTS

| KR | 2003 0012649 | 2/2003 |
| KR | 2006 0031358 | 4/2006 |
| KR | 10 0579844 | 5/2006 |
| KR | 1020060108352 | 10/2006 |

OTHER PUBLICATIONS

Zheng et al. "First-principles study of point defects in LaAlO3". MIT Libraries, Jan. 2007.*
Tan et al. "Hafnium Aluminum Oxide as Charge Storage and Blocking-Oxide Layers in SONOS-Type Nonvolatile Memory for High-Speed Operation". IEEE Transactions on electron device, vol. 53, No. 4, Apr. 2006.*
English Abstract for Publication No. 1020030012649.
English Abstract for Publication No. 1020060031358.
English Abstract for Publication No. 0579844.
English Abstract Publication No. 1020060108352.

* cited by examiner

*Primary Examiner*—Wai-Sing Louie
(74) *Attorney, Agent, or Firm*—F. Chau & Associates, LLC

(57) ABSTRACT

The memory device includes a first tunnel insulation layer pattern on a semiconductor substrate, a second tunnel insulation layer pattern having an energy band gap lower than that of the first tunnel insulation layer pattern on the first tunnel insulation layer pattern, a charge trapping layer pattern on the second tunnel insulation layer pattern, a blocking layer pattern on the charge trapping layer pattern, and a gate electrode on the blocking layer pattern. The memory device further includes a source/drain region at an upper portion of the semiconductor substrate. The upper portion of the semiconductor substrate is adjacent to the first tunnel insulation layer pattern.

18 Claims, 11 Drawing Sheets

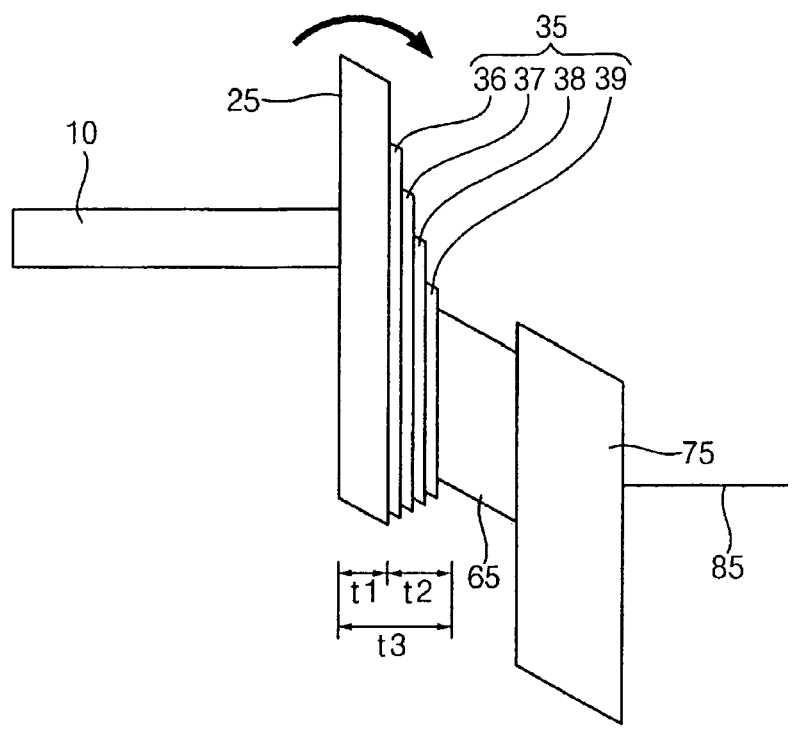
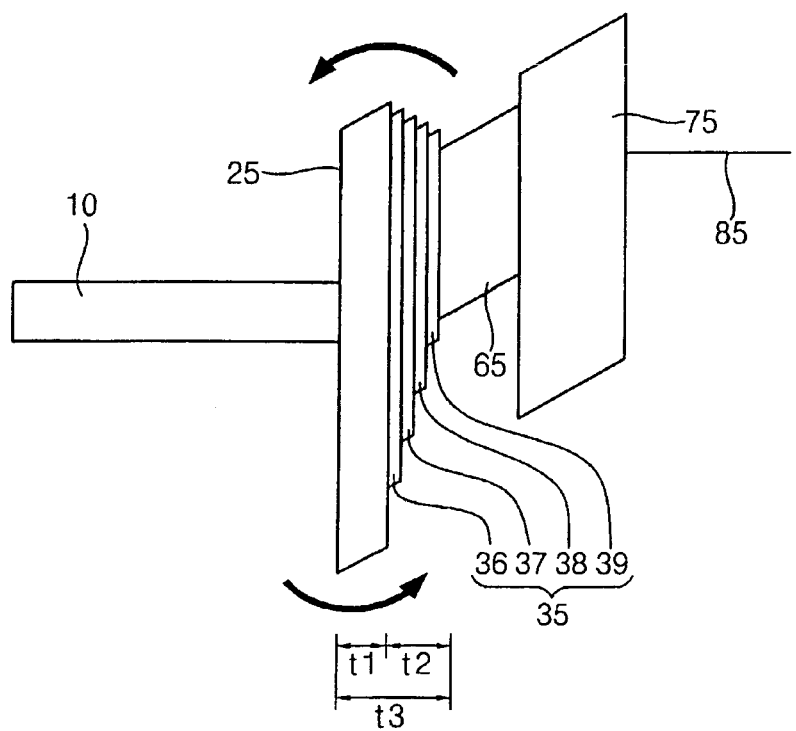

MEMORY DEVICES AND METHODS OF MANUFACTURING THE SAME

CROSS-REFERENCE TO RELATED APPLICATIONS

This application claims priority under 35 USC § 119 to Korean Patent Application No. 2006-103430 filed on Oct. 24, 2006, the contents of which are hereby incorporated by reference herein in their entirety.

BACKGROUND OF THE INVENTION

1. Technical Field

The present disclosure relates to memory devices and methods of manufacturing the same. More particularly, the present disclosure relates to memory devices having improved electrical characteristics and to methods of manufacturing the memory devices.

2. Description of the Related Art

The demand for electrically erasable programmable read only memory (EEPROM) devices and flash memory devices has increased. Flash memory devices may electrically perform programming and erasing operations using hot electron/hole injection or Fowler-Nordheim (FN) tunneling.

Moreover, flash memory devices may be classified into floating gate type memory devices and floating trap type memory devices such as, for example, silicon-oxide-nitride-oxide-silicon (SONOS) memory devices or metal-oxide-nitride-oxide-semiconductor (MONOS) memory devices.

Generally, the floating trap type memory devices include a tunnel insulation layer formed on a semiconductor substrate, a charge trapping layer for trapping electrons or holes moving through a channel region, a blocking layer formed on the charge trapping layer, and a gate electrode formed on the gate electrode.

In the floating trap type memory devices, hot electrons having high energies are injected into a trap site formed in the charge trapping layer to increase a threshold voltage when a data is programmed, whereas hot holes having high energies are injected into the trap site in the charge trapping layer to be recombined with the hot electrons so that the threshold voltage may be decreased when a data is erased. Alternatively, the electrons injected into the charge trapping layer may move to the semiconductor substrate by FN tunneling when data is erased.

A high potential barrier may be formed between the tunnel insulation layer including silicon oxide and the charge trapping layer including silicon nitride. That is, an energy difference of about 3.5 eV may be generated between an energy level of a conduction band of the tunnel insulation layer and that of the charge trapping layer. Additionally, an energy difference of about 4.4 eV may be generated between an energy level of a valence band of the tunnel insulation layer and that of the charge trapping layer. Here, an energy of about 3.5 eV is acquired by hot electrons so that the hot electrons may be injected into the charge trapping layer while programming data, and an energy of about 4.4 eV is acquired by hot holes so that hot holes may be injected into the charge trapping layer while erasing a data. The energy of about 3.5 eV and the energy of about 4.4 eV may be lost so that trap sites may be generated at an interface between the tunnel insulation layer and the semiconductor substrate or in an interior of the tunnel insulation layer. The trap sites may change a threshold voltage, and the electrons or the holes trapped in the charge trapping layer may move into the trap sites. Thus, data retention characteristics of the floating trap type memory devices may be degenerated as programming and erasing operations are repeatedly performed.

To prevent the degeneration of the data retention characteristics, the tunnel insulation layer should be thickly formed. However, when the tunnel insulation layer has a large thickness, electrons or holes may move along a long distance while programming or erasing data. Thus, the speed of data programming/erasing may be decreased and the voltage applied for performing the programming and erasing operations may be increased.

Therefore, there is a need for memory devices which have improved characteristics such as longer data retention time and faster data programming/erasing speeds to thereby prevent the occurrence of the difficulties described above.

SUMMARY OF THE INVENTION

Exemplary embodiments of the present invention provide memory devices having improved data programming/erasing and data retention characteristics.

Exemplary embodiments of the present invention provide methods of manufacturing memory devices having improved data programming/erasing and data retention characteristics.

In accordance with an exemplary embodiment of the present invention, a memory device is provided. The memory device includes a first tunnel insulation layer pattern, a second tunnel insulation layer pattern, a charge trapping layer pattern, a blocking layer pattern, a gate electrode and a source/drain region. The first tunnel insulation layer pattern is formed on a semiconductor substrate. The second tunnel insulation layer pattern having an energy band gap lower than that of the first tunnel insulation layer pattern is formed on the first tunnel insulation layer pattern. The charge trapping layer pattern is formed on the second tunnel insulation layer pattern. The blocking layer pattern is formed on the charge trapping layer pattern. The gate electrode is formed on the blocking layer pattern. The source/drain region is formed at an upper portion of the semiconductor substrate. The upper portion is adjacent to the first tunnel insulation layer pattern.

In an exemplary embodiment of the present invention, the second tunnel insulation layer pattern may have an energy band gap gradient according to a height from the first tunnel insulation layer pattern.

In an exemplary embodiment of the present invention, the second tunnel insulation layer pattern may have an energy band gap decreasing according as the height increases. The energy band gap of the second tunnel insulation layer pattern may be larger than that of the charge trapping layer pattern.

In an exemplary embodiment of the present invention, the second tunnel insulation layer pattern may include a plurality of sub-tunnel insulation layer patterns stacked on the first tunnel insulation layer pattern, each of which has an energy band gap different from one another.

In an exemplary embodiment of the present invention, the energy band gaps of the sub-tunnel insulation layer patterns may decrease as heights of the sub-tunnel insulation layer patterns from the first tunnel insulation layer pattern increase, and the highest sub-tunnel insulation layer pattern thereof may have an energy band gap larger than that of the charge trapping layer pattern.

In an exemplary embodiment of the present invention, the second tunnel insulation layer pattern may include a material of which elements have a composition ratio that varies according to the height.

In an exemplary embodiment of the present invention, the first tunnel insulation layer pattern may include a silicon oxide, and the charge trapping layer pattern may include silicon nitride or hafnium silicon oxide.

In an exemplary embodiment of the present invention, the second tunnel insulation layer pattern may include hafnium silicon oxide (HfSi$_x$O$_y$), silicon nitride (SiN$_x$), zirconium silicon oxide (ZrSi$_x$O$_y$), lanthanum aluminum oxide (LaAl$_x$O$_y$) or hafnium aluminum oxide (HfAl$_x$O$_y$).

In an exemplary embodiment of the present invention, the second tunnel insulation layer pattern may include hafnium silicon oxide and a hafnium content thereof may increase as the height increases.

In accordance with an exemplary embodiment of the present invention, a memory device is provided. The memory device includes a tunnel insulation layer pattern, a composite layer pattern, a blocking layer pattern, a gate electrode and a source/drain region. The tunnel insulation layer pattern is formed on a semiconductor substrate. The composite layer pattern, which has an energy band gap lower than that of the tunnel insulation layer pattern and an energy band gap gradient according to a height from the tunnel insulation layer pattern, is formed on the tunnel insulation layer pattern. The blocking layer pattern is formed on the composite layer pattern. The gate electrode is formed on the blocking layer pattern. The source/drain region is formed at an upper portion of the semiconductor substrate. The upper portion is adjacent to the tunnel insulation layer pattern.

In an exemplary embodiment of the present invention, the energy band gap of the composite layer pattern may decrease as the height increases.

In accordance with an exemplary embodiment of the present invention, a method of manufacturing a memory device is provided. In the method of manufacturing the memory device, a first tunnel insulation layer is formed on a semiconductor substrate. A second tunnel insulation layer having an energy band gap lower than that of the first tunnel insulation layer is formed on the first tunnel insulation layer. A charge trapping layer is formed on the second tunnel insulation layer. A blocking layer is formed on the charge trapping layer. A gate conductive layer is formed on the blocking layer. The gate conductive layer, the blocking layer, the charge trapping layer, the second tunnel insulation layer and the first tunnel insulation layer are patterned to form a first tunnel insulation layer pattern, a second tunnel insulation layer pattern, a charge trapping layer pattern, a blocking layer pattern and a gate electrode stacked on the semiconductor substrate. A source/drain region is formed at an upper portion of the semiconductor substrate by implanting impurities onto the semiconductor substrate. The upper portion is adjacent to the first tunnel insulation layer pattern.

In an exemplary embodiment of the present invention, the second tunnel insulation layer pattern may be formed by forming a plurality of sub-tunnel insulation layers on the first tunnel insulation layer, each of which has an energy band gap different from one another.

In an exemplary embodiment of the present invention, the sub-tunnel insulation layers may be sequentially formed according to a descending order of the energy band gap, and the highest sub-tunnel insulation layer thereof may have an energy band gap larger than that of the charge trapping layer.

In an exemplary embodiment of the present invention, the second tunnel insulation layer may be formed using hafnium silicon oxide (HfSi$_x$O$_y$), silicon nitride (SiN$_x$), zirconium silicon oxide (ZrSi$_x$O$_y$), lanthanum aluminum oxide (LaAl$_x$O$_y$) or hafnium aluminum oxide (HfAl$_x$O$_y$).

In an exemplary embodiment of the present invention, the second tunnel insulation layer may be formed using a material of which elements have a composition ratio that varies according to the height.

In an exemplary embodiment of the present invention, the second tunnel insulation layer may be formed by one of a chemical vapor deposition (CVD) process or an atomic layer deposition (ALD) process.

In an exemplary embodiment of the present invention, the second tunnel insulation layer may be formed by varying flow rates of source gases for forming the second tunnel insulation layer.

In an exemplary embodiment of the present invention, the second tunnel insulation layer may be formed by forming a first portion of the second tunnel insulation layer, which has a predetermined height from the first tunnel insulation layer, and performing a nitridation treatment on the first portion of the second tunnel insulation layer.

In an exemplary embodiment of the present invention, the time and intensity of the nitridation treatment may be varied according to the frequency of the nitridation treatment.

In an exemplary embodiment of the present invention, the second tunnel insulation layer may be formed by forming a second portion of the second tunnel insulation layer, which has a predetermined height from the first tunnel insulation layer, and performing a heat treatment on the second portion of the second tunnel insulation layer.

In an exemplary embodiment of the present invention, time and intensity of the heat treatment may be varied according to a frequency of the heat treatment.

According to some exemplary embodiments of the present invention, a first tunnel insulation layer pattern, which has a first thickness smaller than that of a conventional tunnel insulation layer pattern, and a second tunnel insulation layer pattern, which has an energy band gap smaller than that of the first tunnel insulation layer pattern, are formed on a semiconductor substrate. Thus, a memory device including the first and second tunnel insulation layer patterns in accordance with exemplary embodiments of the present invention may have improved characteristics such as, for example, faster data programming/erasing speeds because the probability that electrons and holes move between a charge trapping layer pattern and a channel region in the semiconductor substrate may be increased while programming or erasing data.

Additionally, a probability that charges trapped in the charge trapping layer pattern move to the semiconductor substrate according as time elapses may be decreased because a total thickness of the first thickness and a second thickness, e.g., the thickness of the second tunnel insulation layer pattern, may be larger than that of the conventional tunnel insulation layer pattern. Thus, the memory device according to exemplary embodiments of the present invention may have improved characteristics such as, for example, a longer data retention time or a higher endurance capacity to a high temperature stress.

BRIEF DESCRIPTION OF THE DRAWINGS

Exemplary embodiments of the present invention can be understood in more detail from the following description taken in conjunction with the accompanying drawings, in which:

FIG. 2B is an energy band diagram of the memory device in FIG. 1A while programming a data;

FIG. 2C is an energy band diagram of the memory device in FIG. 1A while erasing a data;

DETAILED DESCRIPTION OF THE EXEMPLARY EMBODIMENTS

Figure 1A:
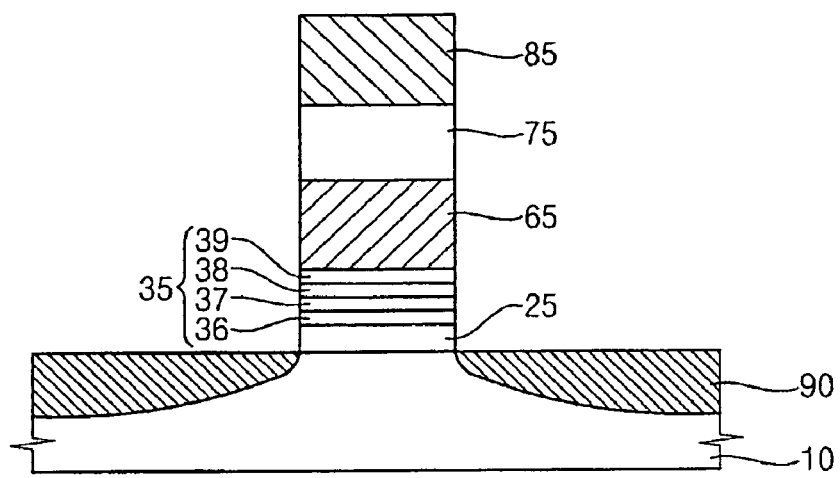
FIGS. 1A to 1C are cross-sectional views illustrating memory devices in accordance with an exemplary embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Hereinafter, exemplary embodiments of the present invention will be explained in detail with reference to the accompanying drawings.

Figure 1B:
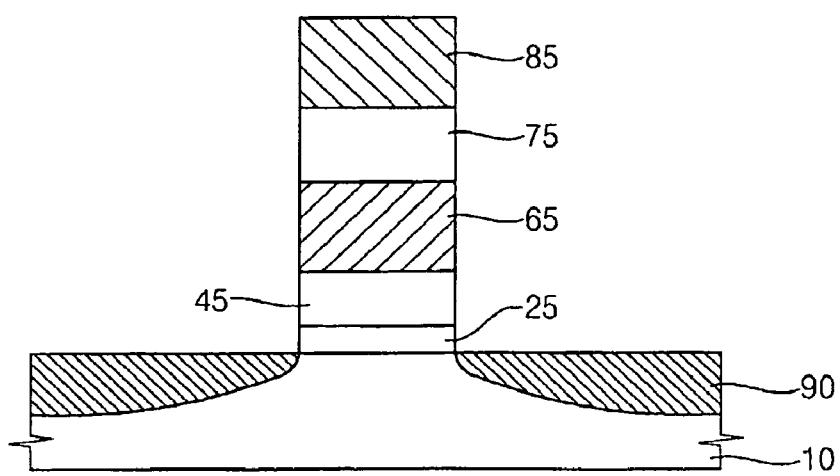
Figure 1C:
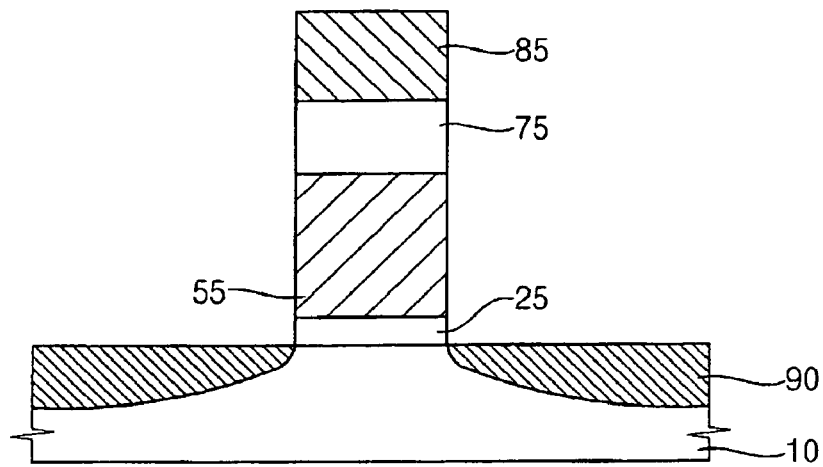

FIGS. 1A to 1C are cross-sectional views illustrating memory devices in accordance with an exemplary embodiment of the present invention. Although FIGS. 1A to 1C illustrate floating trap type memory devices, exemplary embodiments of the present invention may be employed in floating gate type memory devices or volatile memory devices such as, for example, dynamic random access memory (DRAM) devices.

Referring to FIG. 1A, a memory device in accordance with an exemplary embodiment of the present invention includes a gate structure on a semiconductor substrate 10 and a source/drain region 90 at an upper portion of the semiconductor substrate 10, which is adjacent to the gate structure.

The semiconductor substrate 10 may include, for example, silicon oxide. The source/drain region 90 may include, for example, doped silicon oxide.

The gate structure has a first tunnel insulation layer pattern 25, a second tunnel insulation layer pattern 35, a charge trapping layer pattern 65, a blocking layer pattern 75 and a gate electrode 85 sequentially formed on the semiconductor substrate 10.

The first tunnel insulation layer pattern 25 may include, for example, an oxide such as silicon oxide. The first tunnel insulation layer pattern 25 together with the second tunnel insulation layer pattern 35 may electrically insulate the charge trapping layer pattern 65 from the semiconductor substrate 10. The first tunnel insulation layer pattern 25 together with the second tunnel insulation layer pattern 35 may serve as a conventional tunnel insulation layer pattern so that the first tunnel insulation layer pattern 25 may have a thickness smaller than that of the conventional tunnel insulation layer pattern.

The second tunnel insulation layer pattern 35 includes a first sub-tunnel insulation layer pattern 36, a second sub-tunnel insulation layer pattern 37, a third sub-tunnel insulation layer pattern 38 and a fourth sub-tunnel insulation layer pattern 39 sequentially formed on the first tunnel insulation layer pattern 25.

The first sub-tunnel insulation layer pattern 36 may include a material having an energy band gap smaller than that of a material included in the first tunnel insulation layer pattern 25, e.g., silicon oxide, and the second, third and fourth sub-tunnel insulation layer patterns 37, 38 and 39 may include materials, each of which has a sequentially decreasing energy band gap smaller than that of the material included in the first sub-tunnel insulation layer pattern 36. Additionally, the fourth sub-tunnel insulation layer pattern 39 may include a material having an energy band gap larger than that of a material included in the charge trapping layer pattern 65. For example, the first, second, third and fourth sub-tunnel insulation layer patterns 36, 37, 38 and 39 may include hafnium silicon oxide (HfSi$_x$O$_y$), silicon nitride (SiN$_x$), zirconium silicon oxide (ZrSi$_x$O$_y$), lanthanum aluminum oxide (LaAl$_x$O$_y$), or hafnium aluminum oxide (HfAl$_x$O$_y$).

In the meantime, even a material including substantially the same elements may have different energy band gaps according to a composition ratio of the elements therein. For example, even when both of the charge trapping layer pattern 65 and the fourth sub-tunnel insulation layer pattern 39 include silicon nitride, the fourth sub-tunnel insulation layer pattern 39 may have an energy band gap different from that of the charge trapping layer pattern 65. However, a silicon content of the fourth sub-tunnel insulation layer pattern 39 may be higher than that of the charge trapping layer pattern 65 so that the energy band gap of the fourth sub-tunnel insulation layer pattern 39 may be larger than that of the charge tapping layer pattern 65.

The charge trapping layer pattern 65 may include a nitride such as, for example, silicon nitride or a hafnium oxide such as hafnium silicon oxide. The charge trapping layer pattern 65 may trap electrons or holes moving through a channel region formed between each of the source/drain regions 90.

The blocking layer pattern 75 may include an oxide such as metal oxide or silicon oxide. The blocking layer pattern 75 may prevent charges from moving between the charge trapping layer pattern 65 and the gate electrode 85.

The gate electrode 85 may include, for example, polysilicon, metal and/or metal silicide. A voltage may be applied to the gate electrode 85 so that charges in the channel region may be injected into the charge trapping layer pattern 35, or charges trapped in the charge trapping layer pattern 35 may be moved to the channel region.

Referring to FIG. 1B, a memory device in accordance with an exemplary embodiment of the present invention may have a structure substantially the same as or similar to the memory device in FIG. 1A except for the second tunnel insulation layer pattern 35. Thus, like numerals refer to like elements in FIGS. 1A and 1B, and explanations about the like elements are omitted here to avoid repetitions.

The memory device in FIG. 1B includes a gate structure on the semiconductor substrate 10 and the source/drain region 90 at an upper portion of the semiconductor substrate 10.

The gate structure has the first tunnel insulation layer pattern 25, a third tunnel insulation layer pattern 45, the charge trapping layer pattern 65, the blocking layer pattern 75 and the gate electrode 85 sequentially formed on the semiconductor substrate 10.

The third tunnel insulation layer pattern 45 may include a material having an energy band gap smaller than that of a material included in the first tunnel insulation layer pattern 25, e.g., silicon oxide, and larger than that of a material included in the charge trapping layer pattern 65, e.g., silicon nitride. For example, the third tunnel insulation layer pattern 45 may include hafnium silicon oxide, silicon nitride, zirconium silicon oxide, lanthanum aluminum oxide, or hafnium aluminum oxide.

Even when the charge trapping layer pattern 65 includes silicon nitride, the third tunnel insulation layer pattern 45 may include silicon nitride. However, a silicon content of the third tunnel insulation layer pattern 45 may be higher than that of the charge trapping layer pattern 65 so that the third tunnel insulation layer pattern 45 may have an energy band gap higher than that of the charge trapping layer pattern 65.

The third tunnel insulation layer pattern 45 may have an energy band gap gradient according to a height from the first tunnel insulation layer pattern 25. In an exemplary embodiment of the present invention, a composition ratio of elements of the third tunnel insulation layer pattern 45 varies according to the height from the first tunnel insulation layer pattern 25 so that the third tunnel insulation layer pattern 45 may have the energy band gap gradient. For example, when the third tunnel insulation layer pattern 45 includes hafnium silicon oxide, a hafnium content of the third tunnel insulation layer pattern 45 may be increased as the height is increased. The third tunnel insulation layer pattern 45 may have an energy band gap gradient in which an energy band gap decreases as the height increases, because the energy band gap decreases as the hafnium content increases.

As described above, a first portion of the third tunnel insulation layer pattern 45 adjacent to the first tunnel insulation layer pattern 25 may have an energy band gap slightly smaller than that of the first tunnel insulation layer pattern 25. However, a second portion of the third tunnel insulation layer pattern 45 adjacent to the charge trapping layer pattern 65 may have an energy band gap much smaller than that of the first tunnel insulation layer pattern 25. Additionally, the second portion of the third tunnel insulation layer pattern 45 may have an energy band gap larger than that of the charge trapping layer pattern 65.

Alternatively, the third tunnel insulation layer pattern 45 may have an energy band gap gradient according to a height from the first tunnel insulation pattern 25 by including a nitridated material. For example, the third tunnel insulation layer pattern 45 may have a desired energy band gap gradient by including a material each portion of which is nitridated to a degree substantially different from one another according to the height, because even substantially the same materials may have different energy band gaps by a nitridation treatment.

Referring to FIG. 1C, a memory device in accordance with an exemplary embodiment of the present invention may have a structure substantially the same as or similar to the memory device in FIG. 1A except for the second tunnel insulation layer pattern 35 and the charge trapping layer pattern 65. Thus, like numerals refer to like elements in FIGS. 1A and 1C, and explanations about the like elements are omitted here to avoid repetitions.

The memory device in FIG. 1C includes a gate structure on the semiconductor substrate 10 and the source/drain region 90 at an upper portion of the semiconductor substrate 10.

The gate structure has the first tunnel insulation layer pattern 25, a composite layer pattern 55, the blocking layer pattern 75 and the gate electrode 85 sequentially formed on the semiconductor substrate 10.

The composite layer pattern 55 includes a material having an energy band gap smaller than that of a material included in the first tunnel insulation layer pattern 25, e.g., silicon oxide. For example, the composite layer pattern 55 may include a hafnium oxide such as hafnium silicon oxide.

The composite layer pattern 55 may have an energy band gap gradient according to a height from the first tunnel insulation layer pattern 25. Thus, a lower portion of the composite layer pattern 55 having an energy band gap above a given value may not trap charges. However, an upper portion of the composite layer pattern 55 having an energy band gap below a given value may trap charges. That is, the composite layer pattern 55 may serve not only as a tunnel insulation layer pattern but also as a charge trapping layer pattern.

In an exemplary embodiment of the present invention, a composition ratio of elements of a material included in the composite layer pattern 55 varies according to the height from the first tunnel insulation layer pattern 25 so that the composite layer pattern 55 may have the energy band gap gradient. For example, when the composite layer pattern 55 includes hafnium silicon oxide, a hafnium content of the composite layer pattern 55 may increase as the height increases. Thus, the composite layer pattern 55 may have an energy band gap gradient in which an energy band gap decreases as the height increases because the energy band gap decreases as the hafnium content increases.

A first portion of the composite layer pattern 55 adjacent to the first tunnel insulation layer pattern 25 may have an energy band gap slightly smaller than that of the first tunnel insulation layer pattern 25. However, a second portion of the composite layer pattern 55 adjacent to the blocking layer pattern 75 may have an energy band gap much smaller than that of the first tunnel insulation layer pattern 25.

In an exemplary embodiment of the present invention, the composite layer pattern 55 may have an energy band gap gradient according to the height from the first tunnel insulation layer pattern 25 by including a nitridated material. For example, the composite layer pattern 55 may have a desired energy band gap gradient by including a material each portion of which is nitridated to a degree substantially different from one another according to the height because even substantially the same material may have different energy band gaps by a nitridation treatment.

In an exemplary embodiment of the present invention, the composite layer pattern 55 includes a thermally treated material so that the composite layer pattern 55 may have not only a third portion having charge trapping characteristics but also a fourth portion not having charge trapping characteristics according to the height. The composite layer pattern 55 may have a desired energy band gap gradient by including a material each portion of which is thermally treated to a degree substantially different from one another according to the height because charge trapping characteristics of a material may be decreased by a heat treatment.

Figure 2A:
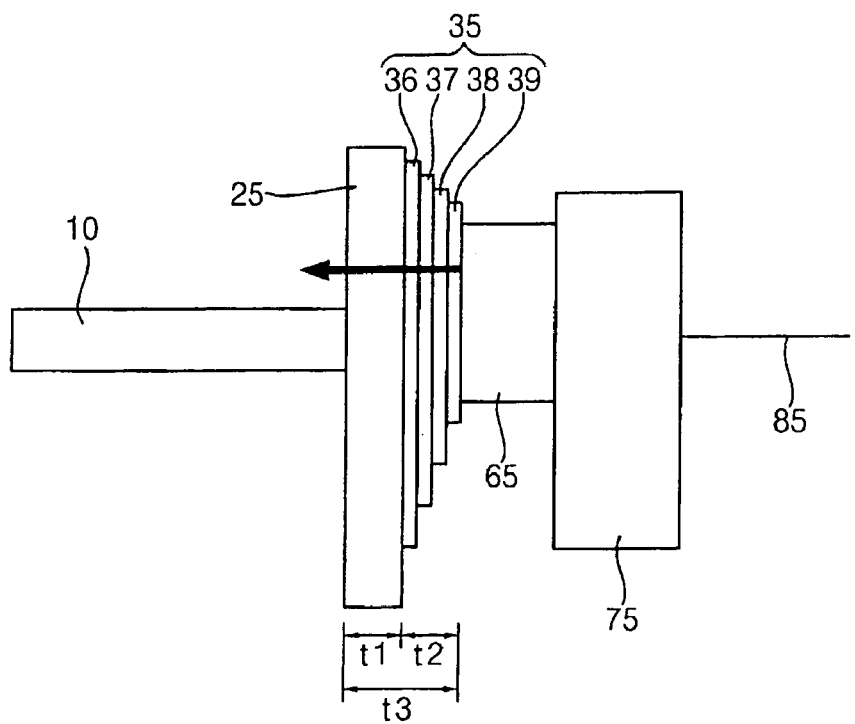
FIG. 2A is an energy band diagram of the memory device in FIG. 1A.

FIG. 2A is an energy band diagram illustrating the memory device in FIG. 1A, FIG. 2B is an energy band diagram illustrating the memory device in FIG. 1A while programming a data, and FIG. 2C is an energy band diagram illustrating the memory device in FIG. 1A while erasing a data.

Referring to FIGS. 1A and 2A, the first and second tunnel insulation layer patterns 25 and 35 in the memory device may serve as a conventional tunnel insulation layer. Thus, as described above, the first tunnel insulation layer pattern 25 may have a first thickness t1 smaller than that of the conventional tunnel insulation layer. However, a third thickness t3, e.g., a sum of the first thickness t1 and a second thickness t2 of the second tunnel insulation layer pattern 35, may be larger than that of the conventional tunnel insulation layer.

The probability that electrons trapped in a charge trapping layer move to a semiconductor substrate as time elapses generally depends on a thickness of the tunnel insulation layer. In an exemplary embodiment of the present invention, the probability that electrons trapped in the charge trapping layer pattern 65 move to the semiconductor substrate 10 is low because the third thickness t3, e.g., the sum of the first and second thicknesses t1 and t2 of the first and second tunnel insulation layer patterns 25 and 35, respectively, serving as the tunnel insulation layer is larger than that of the conventional tunnel insulation layer. Thus, the memory device having the first and second tunnel insulation layer patterns 25 and 35 may have improved characteristics such as a longer data retention time or a higher endurance capacity to a high temperature stress.

Referring to FIG. 2B, the memory device in accordance with an exemplary embodiment of the present invention may have a probability that electrons in a channel region formed in the semiconductor substrate 10 move to the charge trapping layer pattern 65 while programming a data higher than that of the conventional memory device, because the memory device includes the first tunnel insulation layer pattern 25, which has the first thickness t1 smaller than that of the conventional tunnel insulation layer, and the second tunnel insulation layer pattern 35, which has an energy level of a conduction band lower than that of the first tunnel insulation layer pattern 25. Thus, the memory device may have improved data programming characteristics.

Referring to FIG. 2C, the memory device in accordance with an exemplary embodiment of the present invention may have a probability that holes in the channel region of the semiconductor substrate 10 move to the charge trapping layer pattern 65 while erasing a data higher than that of the conventional memory device, because the memory device includes the first tunnel insulation layer pattern 25, which has the first thickness t1 smaller than that of the conventional tunnel insulation layer, and the second tunnel insulation layer pattern 35, which has an energy level of a valence band higher than that of the first tunnel insulation layer pattern 25. Additionally, the memory device may have a probability that electrons in the charge trapping layer pattern 65 move to the channel region of the semiconductor substrate 10 while erasing a data higher than that of the conventional memory device, because the memory device includes the second tunnel insulation layer pattern 35, which has the energy level of a conduction band lower than that of the first tunnel insulation layer pattern 25. Thus, the memory device may have improved data erasing characteristics.

Energy band diagrams of the memory devices in FIGS. 1B and 1C are not shown, but may have similar types to the energy band diagram of the memory device in FIG. 1A. Thus, the memory devices in FIGS. 1B and 1C may have improved characteristics such as, for example, a longer data retention time, a higher endurance capacity to a high temperature stress and/or a faster data programming/erasing speed.

FIGS. 3A to 3E are cross-sectional views illustrating a method of manufacturing a memory device in accordance with an exemplary embodiment of the present invention.

Figure 3A:
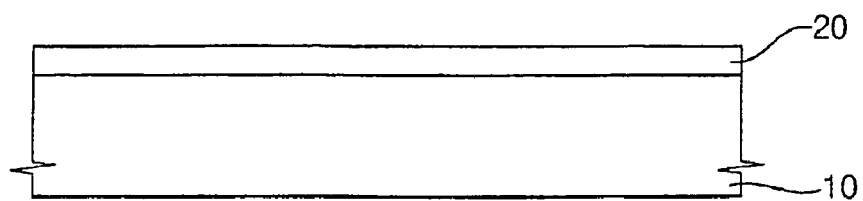
FIGS. 3A to 3E are cross-sectional views illustrating a method of manufacturing a memory device in accordance with an exemplary embodiment of the present invention.

Referring to FIG. 3A, an isolation layer is formed at an upper portion of the semiconductor substrate 10 to define an active region. The semiconductor substrate 10 may include, for example, silicon. The isolation layer may be formed by, for example, a local oxidation of silicon (LOCOS) process or a shallow trench isolation (STI) process.

A first tunnel insulation layer 20 is formed on the semiconductor substrate 10. The first tunnel insulation layer 20 may include an oxide such as, for example, silicon oxide. The first tunnel insulation layer 20 may be formed using, for example, a thermal oxidation process or a chemical vapor deposition (CVD) process.

Figure 3B:
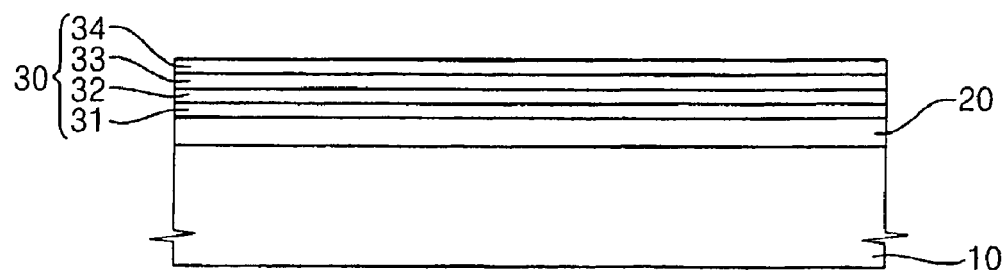

Referring to FIG. 3B, a second tunnel insulation layer 30 is formed on the first tunnel insulation layer 20. That is, a first sub-tunnel insulation layer 31, a second sub-tunnel insulation layer 32, a third sub-tunnel insulation layer 33 and a fourth sub-tunnel insulation layer 34 are sequentially stacked on the first tunnel insulation layer 20 to form the second tunnel insulation layer 30.

The first sub-tunnel insulation layer 31 may be formed using a material having an energy band gap smaller than that of a material included in the first tunnel insulation layer 20, e.g., silicon oxide, and the second, third and fourth sub-tunnel insulation layer 32, 33 and 34 may be formed using materials each of which has a sequentially decreasing energy band gap smaller than that of the material included in the first sub-tunnel insulation layer 31. The fourth sub-tunnel insulation layer 34 may be formed using a material having an energy band gap larger than that of a material, e.g., silicon nitride, included in a charge trapping layer 60 successively formed.

For example, the first, second, third and fourth sub-tunnel insulation layers 31, 32, 33 and 34 may be formed using, for example, hafnium silicon oxide ($HfSi_xO_y$), silicon nitride ($SiN_x$), zirconium silicon oxide ($ZrSi_xO_y$), lanthanum aluminum oxide ($LaAl_xO_y$), or hafnium aluminum oxide ($HfAl_xO_y$).

In the meantime, even when the charge trapping layer 60 is formed using silicon nitride, the fourth sub-tunnel insulation layer 34 may be also formed using silicon nitride because even a material including substantially the same elements may have different energy band gaps according to a composition ratio of the elements. However, the charge trapping layer 60 may be formed to have a silicon content lower than that of the fourth sub-tunnel insulation layer 34 so that the energy band gap of the charge tapping layer 60 may be smaller than that of the fourth sub-tunnel insulation layer 34.

The first, second, third and fourth sub-tunnel insulation layers 31, 32, 33 and 34 may be formed using, for example, a CVD process or an atomic layer deposition (ALD) process.

Figure 3C:
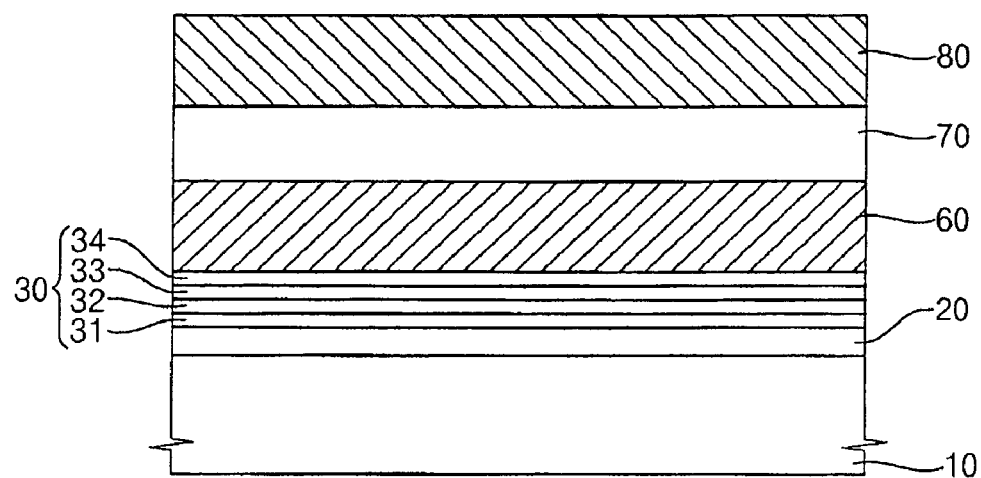

Referring to FIG. 3C, the charge trapping layer 60, a blocking layer 70 and a gate conductive layer 80 are formed on the second tunnel insulation layer 30.

The charge trapping layer 60 may be formed using, for example, a nitride such as silicon nitride or a hafnium oxide such as hafnium silicon oxide. The charge trapping layer 60 may be formed, for example, by a CVD process or a low pressure chemical vapor deposition (LPCVD) process. A heat treatment process may be further performed to prevent an undesired layer from being formed on the charge trapping layer 60 in a successive process for forming the blocking layer 70.

The blocking layer 70 may be formed using, for example, an oxide such as metal oxide or silicon oxide. The blocking layer 70 may be formed, for example, by a CVD process or an ALD process.

The gate conductive layer 80 may be formed using, for example, polysilicon, metal and/or metal silicide. The gate conductive layer 80 may be formed by, for example, a CVD process, an ALD process or a physical vapor deposition (PVD) process.

Figure 3D:
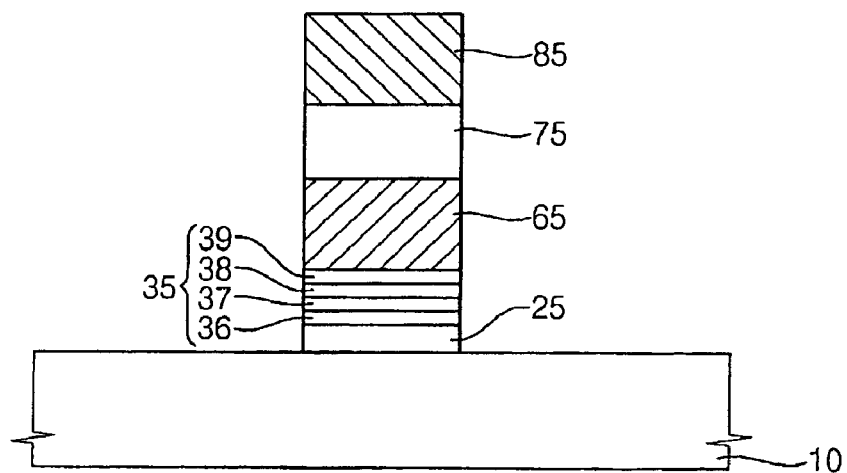

Referring to FIG. 3D, a photoresist pattern is formed on the gate conductive layer 80. The gate conductive layer 80, the blocking layer 70, the charge trapping layer 60, the second tunnel insulation layer 30 and the first tunnel insulation layer 20 are patterned using the photoresist pattern as an etching mask to form a gate structure including a first tunnel insulation layer pattern 25, a second tunnel insulation layer pattern 35, a charge trapping layer pattern 65, a blocking layer pattern 75 and a gate electrode 85 sequentially stacked on the semiconductor substrate 10. The second tunnel insulation layer pattern 35 includes a first sub-tunnel insulation layer pattern 36, a second sub-tunnel insulation layer pattern 37, a third sub-tunnel insulation layer pattern 38 and a fourth sub-tunnel insulation layer pattern 39 sequentially stacked on the first tunnel insulation layer pattern 25. The photoresist pattern may be removed from the gate electrode 85 by, for example, an ashing process and/or a stripping process.

A spacer may be further formed on a sidewall of the gate structure. The spacer may be formed using, for example, silicon nitride by a CVD process.

Figure 3E:
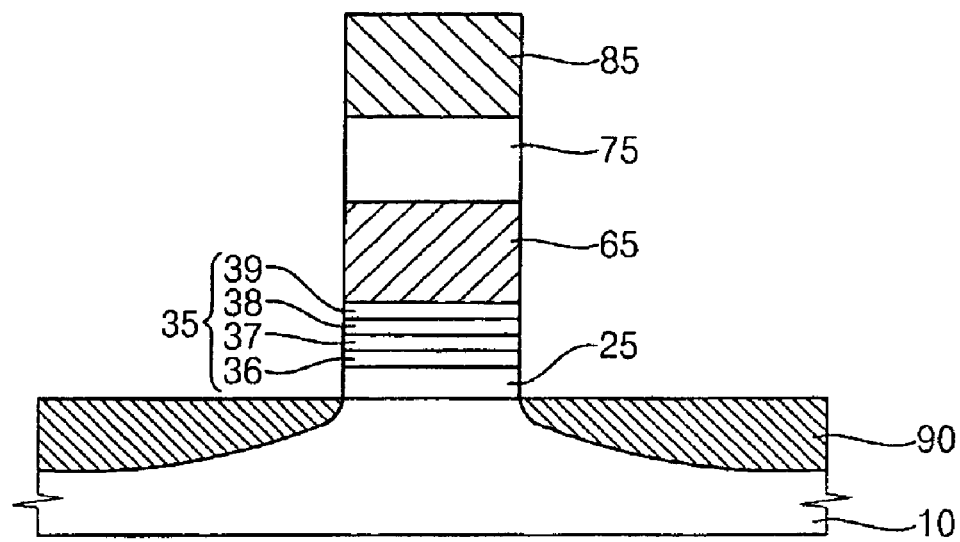

Referring to FIG. 3E, a source/drain region 90 may be formed at an upper portion of the semiconductor substrate 10 adjacent to the gate structure. The source/drain region 90 may be formed using the gate structure as an ion implantation mask by an ion implantation process and a heat treatment process. Thus, the memory device in FIG. 1A is completed.

FIGS. 4A to 4E are cross-sectional views illustrating a method of manufacturing a memory device in accordance with an exemplary embodiment of the present invention. The method of manufacturing the memory device with reference to FIGS. 4A to 4E may be substantially the same as or similar to the method of manufacturing the memory device in FIG. 1A with reference to FIGS. 3A to 3E, except for the process for forming the second tunnel insulation layer 30. Thus, like numerals refer to like elements in FIGS. 4A to 4E and FIG. 1A, and explanations about the like elements are omitted here to avoid repetitions.

Figure 4A:
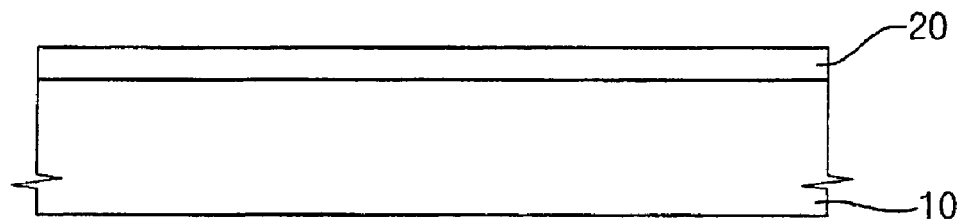
FIGS. 4A to 4E are cross-sectional views illustrating a method of manufacturing a memory device in accordance with an exemplary embodiment of the present invention.

Referring to FIG. 4A, an isolation layer is formed at an upper portion of the semiconductor substrate 10 to define an active region, and the first tunnel insulation layer 20 is formed on the semiconductor substrate 10.

Figure 4B:
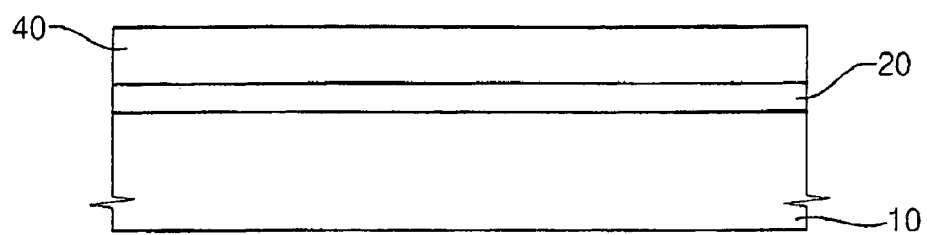

Referring to FIG. 4B, a third tunnel insulation layer 40 is formed on the first tunnel insulation layer 20. The third tunnel insulation layer 40 may be formed using a material having an energy band gap smaller than that of a material included in the first tunnel insulation layer 20, e.g., silicon oxide, and larger than that of a material included in the charge trapping layer 60 successively formed, e.g., silicon nitride. For example, the third tunnel insulation layer 40 may be formed using hafnium silicon oxide, silicon nitride, zirconium silicon oxide, lanthanum aluminum oxide, or hafnium aluminum oxide.

Even when the charge trapping layer 60 is formed using silicon nitride, the third tunnel insulation layer 40 may be also formed using silicon nitride because even a material including substantially the same elements may have different energy band gaps according to a composition ratio of the elements. However, the charge trapping layer 60 may be formed to have a silicon content lower than that of the third tunnel insulation layer 40 so that the energy band gap of the charge tapping layer 60 may be smaller than that of the third tunnel insulation layer 40.

In an exemplary embodiment of the present invention, the third tunnel insulation layer 40 may have an energy band gap gradient according to a height from the first tunnel insulation layer 20 by varying a composition ratio of elements of the third tunnel insulation layer 40. The composition ratio of the elements of the third tunnel insulation layer 40 may be varied by changing flow rates of source gases for forming the third tunnel insulation layer 40 as time elapses when the third tunnel insulation layer 40 is formed by, for example, a CVD process or an ALD process. For example, when the third tunnel insulation layer 40 is formed using hafnium silicon oxide, the third tunnel insulation layer 40 may have the energy band gap gradient according to the height by increasing or decreasing a flow rate of a hafnium source gas or a silicon source gas as time elapses.

In an exemplary embodiment of the present invention, the third tunnel insulation layer 40 may be formed to have an energy band gap gradient in which the energy band gap decreases as the height increases by increasing the flow rate of the hafnium source gas or decreasing the flow rate of the silicon source gas because the energy band gap decreases as the hafnium content increases.

A first portion of the third tunnel insulation layer 40, which is formed at an initial stage and adjacent to the first tunnel insulation layer 20, may have an energy band gap slightly smaller than that of the first tunnel insulation layer 20. However, a second portion of the third tunnel insulation layer 40, which is formed at a last stage and adjacent to the charge trapping layer 60, may have an energy band gap much smaller than that of the first tunnel insulation layer 20. Additionally, the second portion of the third tunnel insulation layer 40 may have an energy band gap larger than that of the charge trapping layer 60.

Alternatively, the third tunnel insulation layer 40 may be formed to have an energy band gap gradient according to the height by a nitridation treatment because a nitridated material may have a decreased energy band gap. In an exemplary embodiment of the present invention, a process for forming a portion of the third tunnel insulation layer 40 and a process for nitridating the portion of the third tunnel insulation layer 40 are repeatedly performed to form the third tunnel insulation layer 40. The third tunnel insulation layer 40 may be formed to have a desired energy band gap gradient by controlling time or intensity of the nitridation treatment.

Figure 4C:
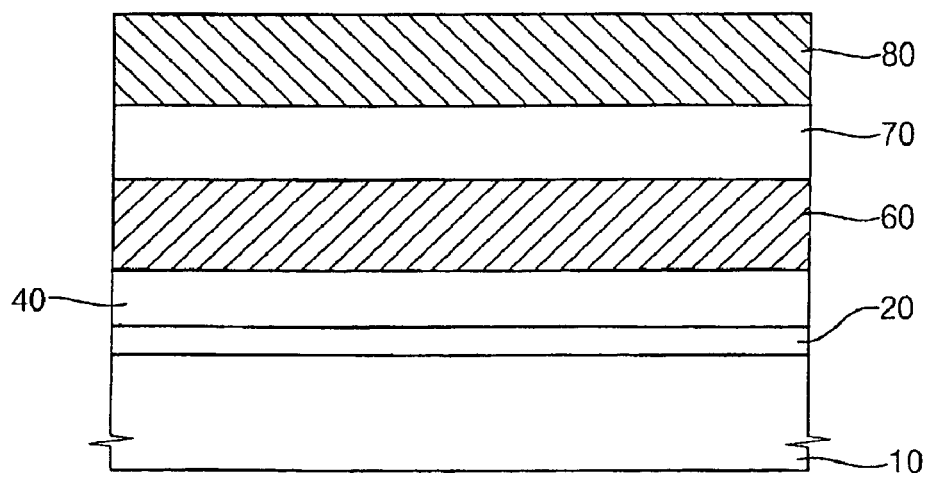

Referring to FIG. 4C, the charge trapping layer 60, a blocking layer 70 and a gate conductive layer 80 are formed on the third tunnel insulation layer 40.

Figure 4D:
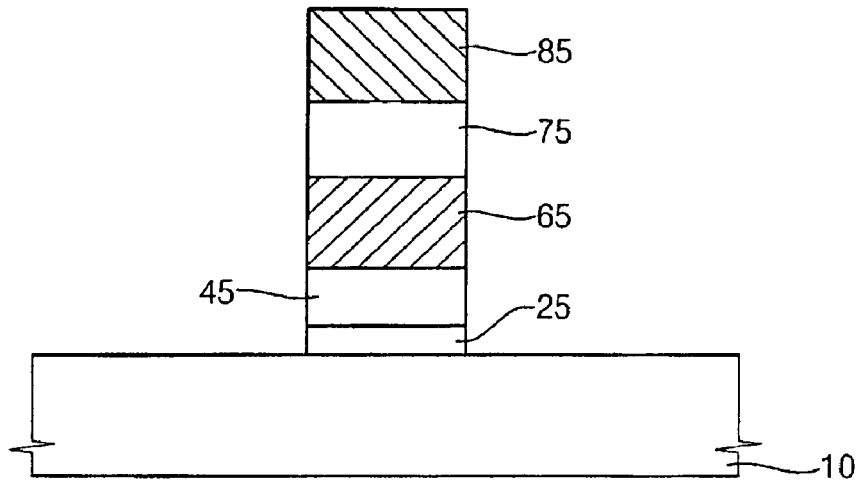

Referring to FIG. 4D, the gate conductive layer 80, the blocking layer 70, the charge trapping layer 60, the third tunnel insulation layer 40 and the first tunnel insulation layer 20 are patterned by an etching process using, for example, a photoresist pattern as an etching mask to form a gate structure including a first tunnel insulation layer pattern 25, a third tunnel insulation layer pattern 45, the charge trapping layer pattern 65, the blocking layer pattern 75 and the gate electrode 85 sequentially stacked on the semiconductor substrate 10.

Figure 4E:
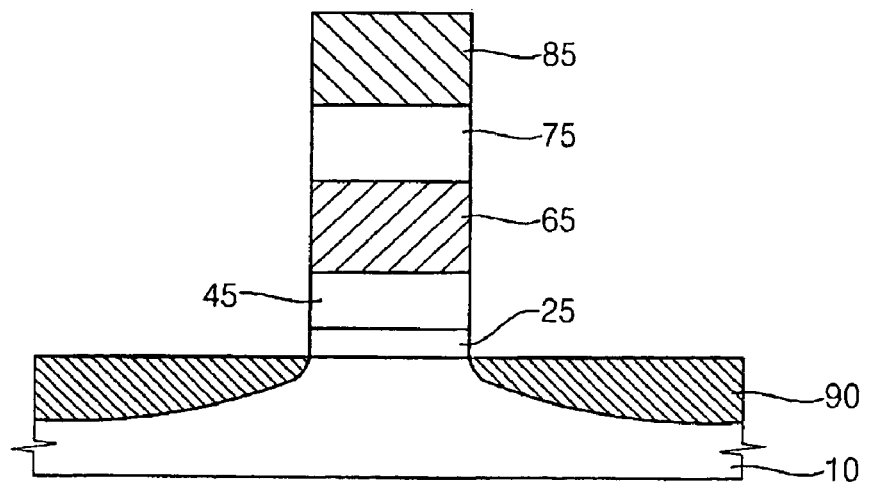

Referring to FIG. 4E, the source/drain region 90 is formed at an upper portion of the semiconductor substrate 10 adjacent to the gate structure. Thus, the memory device in FIG. 1B is completed.

FIGS. 5A to 5E are cross-sectional views illustrating a method of manufacturing a memory device in accordance with an exemplary embodiment of the present invention. The method of manufacturing the memory device with reference to FIGS. 5A to 5E may be substantially the same as or similar to the method of manufacturing the memory device in FIG. 1A with reference to FIGS. 3A to 3E, except for the process for forming the second tunnel insulation layer 30 and the charge trapping layer 60. Thus, like numerals refer to like elements in FIGS. 5A to 5E and FIG. 1A, and explanations about the like elements are omitted here to avoid repetitions.

Figure 5A:
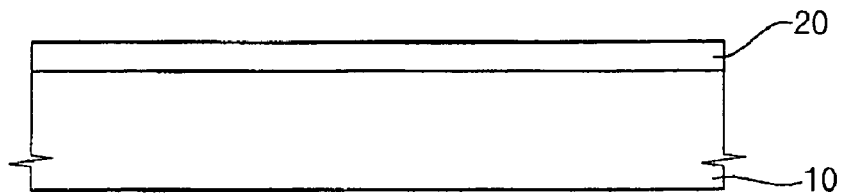
FIGS. 5A to 5E are cross-sectional views illustrating a method of manufacturing a memory device in accordance with an exemplary embodiment of the present invention.

Referring to FIG. 5A, an isolation layer is formed at an upper portion of the semiconductor substrate 10 to define an active region, and the first tunnel insulation layer 20 is formed on the semiconductor substrate 10.

Figure 5B:
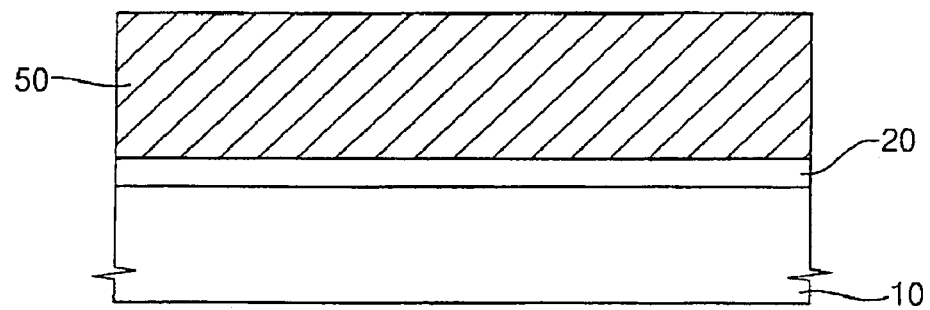

Referring to FIG. 5B, a composite layer 50 is formed on the first tunnel insulation layer 20. The composite layer 50 may be formed using, for example, a hafnium oxide such as hafnium silicon oxide (HfSiO) by a CVD process or an ALD process. In an exemplary embodiment of the present invention, when the composite layer 50 is formed using hafnium silicon oxide, the composite layer 50 may be formed to have an energy band gap gradient according to a height from the first tunnel insulation layer 20 by varying a flow rate of a hafnium source gas or a silicon source gas as time elapses. That is, the composite layer 50 may be formed to have an energy band gap gradient in which the energy band gap decreases as the height increases by increasing the flow rate of the hafnium source gas or decreasing the flow rate of the silicon source gas as time elapses. As a result, a lower portion of the composite layer 50 adjacent to the first tunnel insulation layer 20 may have characteristics wherein charges are not trapped therein. However, an upper portion of the composite layer 50 may have characteristics wherein charges are trapped therein. Thus, the composite layer 50 may be formed to have the lower portion serving as a tunnel insulation layer and the upper portion serving as a charge trapping layer.

Alternatively, the composite layer 50 may be formed to have an energy band gap gradient according to the height from the first tunnel insulation layer 20 by a nitridation treatment. In an exemplary embodiment of the present invention, a process for forming a portion of the composite layer 50 and a process for nitridating the portion of the composite layer 50 are repeatedly performed to form the composite layer 50. The composite layer 50 may be formed to have a desired energy band gap gradient by controlling time or intensity of the nitridation treatment.

Furthermore, the characteristics of trapping charges of the composite layer 50 may be decreased by a heat treatment. In an exemplary embodiment of the present invention, a process for forming a portion of the composite layer 50 and a process for thermally treating the portion of the composite layer 50 are repeatedly performed to form the composite layer 50. The composite layer 50 may be formed to have a desired energy band gap gradient by controlling time or intensity of the heat treatment.

Figure 5C:
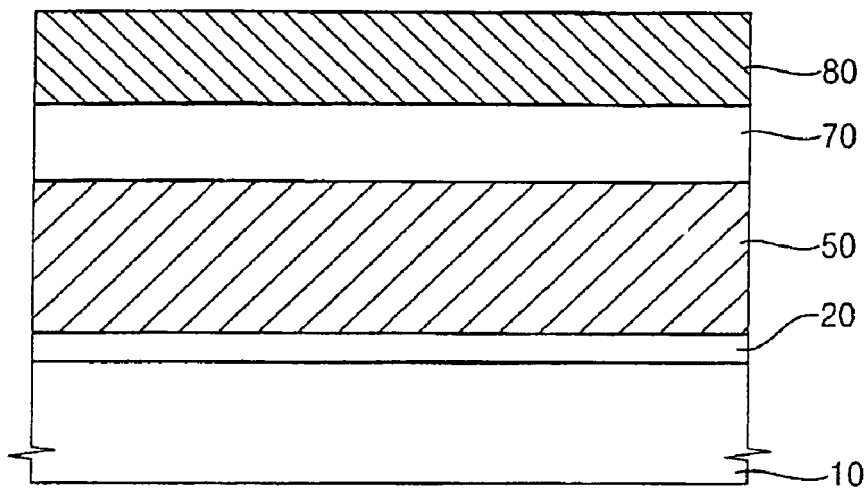

Referring to FIG. 5C, the blocking layer 70 and the gate conductive layer 80 are formed on the composite layer 50.

Figure 5D:
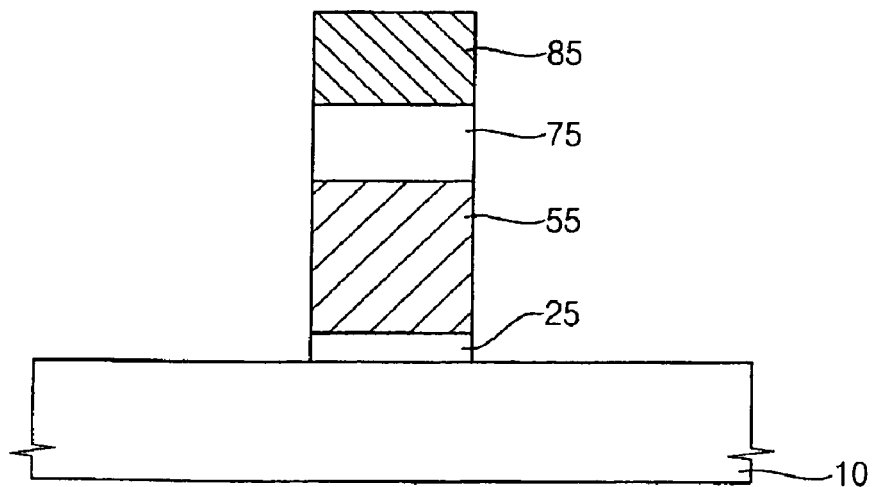

Referring to FIG. 5D, the gate conductive layer 80, the blocking layer 70, the composite layer 50 and the first tunnel insulation layer 20 are patterned by an etching process using, for example, a photoresist pattern as an etching mask to form a gate structure including a first tunnel insulation layer pattern 25, a composite layer pattern 55, a blocking layer pattern 75 and a gate electrode 85 sequentially stacked on the semiconductor substrate 10.

Figure 5E:
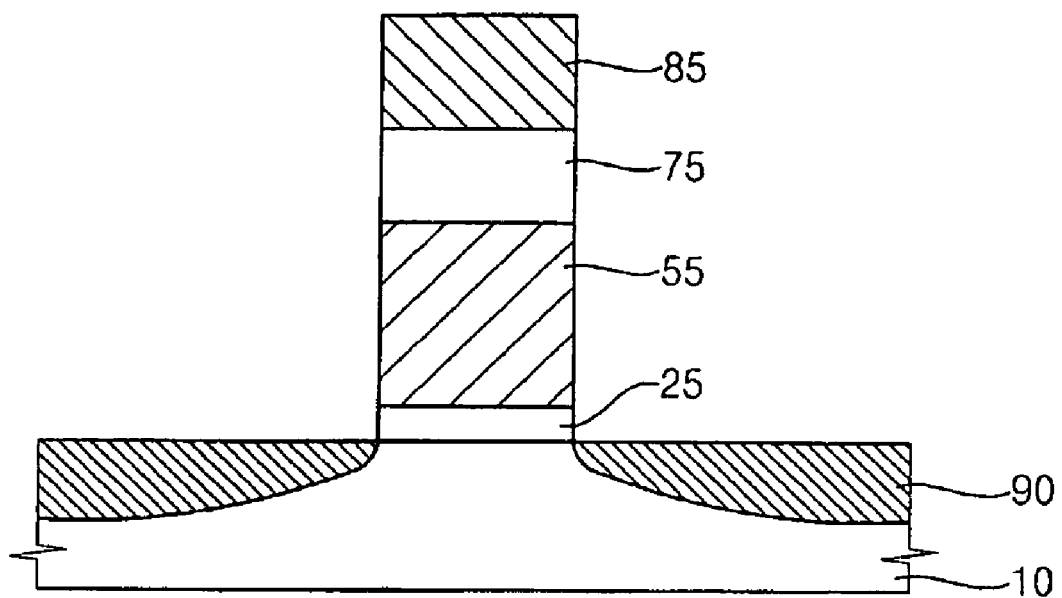

Referring to FIG. 5E, the source/drain region 90 is formed at an upper portion of the semiconductor substrate 10 adjacent to the gate structure. Thus, the memory device in FIG. 1C is completed.

Although FIGS. 3A to 3E, 4A to 4E and 5A to 5E illustrate methods of manufacturing floating trap type memory devices, exemplary embodiments of the present invention may also be employed in methods of manufacturing floating gate type memory devices or volatile memory devices such as, for example, DRAM devices.

According to some exemplary embodiments of the present invention, a first tunnel insulation layer pattern, which has a first thickness smaller than that of a conventional tunnel insulation layer pattern, and a second tunnel insulation layer pattern, which has an energy band gap smaller than that of the first tunnel insulation layer pattern, are formed on a semiconductor substrate. Thus, a memory device including the first and second tunnel insulation layer patterns in accordance with exemplary embodiments of the present invention may have improved data programming and erasing characteristics because at the very least a probability that electrons and holes move between a charge trapping layer pattern and a channel region in the semiconductor substrate may be increased while programming or erasing data.

Additionally, a probability that charges trapped in the charge trapping layer pattern move to the semiconductor substrate as time elapses may be decreased because a total thickness of the first thickness and a second thickness, e.g. a thickness of the second tunnel insulation layer pattern, may be larger than that of the conventional tunnel insulation layer pattern. Thus, the memory device may have improved characteristics such as, for example, a longer data retention time and/or a higher endurance capacity to a high temperature stress.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A memory device comprising:
   a first tunnel insulation layer pattern on a semiconductor substrate;
   a second tunnel insulation layer pattern on the first tunnel insulation layer pattern, wherein the second tunnel insulation layer pattern has an energy band gap lower than that of the first tunnel insulation layer pattern, and the second tunnel insulation layer pattern has an energy band gap gradient according to a height of the second tunnel insulation layer pattern from the first tunnel insulation layer pattern;
   a charge trapping layer pattern on the second tunnel insulation layer pattern;
   a blocking layer pattern on the charge trapping layer pattern;
   a gate electrode on the blocking layer pattern; and
   a source/drain region at an upper portion of the semiconductor substrate, the upper portion being adjacent to the first tunnel insulation layer pattern.

2. The memory device of claim 1, wherein the second tunnel insulation layer pattern has an energy band gap which decreases as the height increases, and wherein the energy band gap is larger than that of the charge trapping layer pattern.

3. The memory device of claim 1, wherein the second tunnel insulation layer pattern includes a plurality of sub-tunnel insulation layer patterns stacked on the first tunnel insulation layer pattern, each of the sub-tunnel insulation layer patterns configured to have an energy band gap different from one another.

4. The memory device of claim 3, wherein the energy band gaps of the sub-tunnel insulation layer patterns decrease as heights of the sub-tunnel insulation layer patterns from the first tunnel insulation layer pattern increase, and wherein a highest sub-tunnel insulation layer pattern thereof has an energy band gap larger than that of the charge trapping layer pattern.

5. The memory device of claim 1, wherein the second tunnel insulation layer pattern includes a material, and wherein a composition ratio of elements of the material is configured to vary according to the height.

6. The memory device of claim 1, wherein the first tunnel insulation layer pattern includes a silicon oxide, and the charge trapping layer pattern includes silicon nitride or hafnium silicon oxide.

7. The memory device of claim 6, wherein the second tunnel insulation layer pattern comprises a material selected from the group consisting of hafnium silicon oxide (HfSi$_x$O$_y$), silicon nitride (SiN$_x$), zirconium silicon oxide (ZrSi$_x$O$_y$), lanthanum aluminum oxide (LaAl$_x$O$_y$) and hafnium aluminum oxide (HfAl$_x$O$_y$).

8. The memory device of claim 7, wherein the second tunnel insulation layer pattern includes hafnium silicon oxide, and wherein a hafnium content of the second tunnel insulation layer pattern is configured to increase as the height increases.

9. A memory device comprising:
   a tunnel insulation layer pattern on a semiconductor substrate;
   a composite layer pattern on the tunnel insulation layer pattern, the composite layer pattern has an energy band gap lower than that of the tunnel insulation layer pattern, and the composite layer pattern has an energy band gap gradient according to a height of the composite layer pattern from the tunnel insulation layer pattern;
   a blocking layer pattern on the composite layer pattern;
   a gate electrode on the blocking layer pattern; and
   a source/drain region at an upper portion of the semiconductor substrate, the upper portion being adjacent to the tunnel insulation layer pattern.

10. The memory device of claim 9, wherein the energy band gap of the composite layer pattern decreases as the height increases.

11. A method of manufacturing a memory device, the method comprising:
   forming a first tunnel insulation layer on a semiconductor substrate;
   forming a second tunnel insulation layer on the first tunnel insulation layer, wherein the second tunnel insulation layer has an energy band gap lower than that of the first tunnel insulation layer, and the second tunnel insulation layer has an energy band gap gradient according to a height of the second tunnel insulation layer from the first tunnel insulation layer;
   forming a charge trapping layer on the second tunnel insulation layer;
   forming a blocking layer on the charge trapping layer;
   forming a gate conductive layer on the blocking layer;
   forming a first tunnel insulation layer pattern, a second tunnel insulation layer pattern, a charge trapping layer pattern, a blocking layer pattern and a gate electrode stacked on the semiconductor substrate by patterning the gate conductive layer, the blocking layer, the charge trapping layer, the second tunnel insulation layer and the first tunnel insulation layer and
   forming a source/drain region at an upper portion of the semiconductor substrate by implanting impurities onto the semiconductor substrate, the upper portion being adjacent to the first tunnel insulation layer pattern.

12. The method of claim 11, wherein the formation of the second tunnel insulation layer pattern includes forming a plurality of sub-tunnel insulation layers on the first tunnel insulation layer, each of the sub-tunnel insulation layers configured to have an energy band gap different from one another.

13. The method of claim 12, wherein the sub-tunnel insulation layers are sequentially formed according to descending order of the energy band gap, and wherein a highest sub-tunnel insulation layer thereof has an energy band gap larger than that of the charge trapping layer.

14. The method of claim 11, wherein the second tunnel insulation layer is formed using a material selected from the group consisting of hafnium silicon oxide (HfSi$_x$O$_y$), silicon nitride ($SiN_x$), zirconium silicon oxide ($ZrSi_xO_y$), lanthanum aluminum oxide ($LaAl_xO_y$) and hafnium aluminum oxide ($HfAl_xO_y$).

15. The method of claim 11, wherein the second tunnel insulation layer is formed using a material, and wherein a composition ratio of elements of the material is configured to vary according to the height.

16. The method of claim 15, wherein the second tunnel insulation layer is formed by one of a chemical vapor deposition (CVD) process or an atomic layer deposition (ALD) process.

17. The method of claim 16, wherein forming the second tunnel insulation layer comprises forming a first portion of the second tunnel insulation layer and performing a nitridation treatment on the first portion of the second tunnel insulation layer.

18. The method of claim 16, wherein the formation of the second tunnel insulation layer comprises forming a second portion of the second tunnel insulation layer and performing a heat treatment on the second portion of the second tunnel insulation layer.

* * * * *